US007284219B1

(12) United States Patent
Manaker, Jr. et al.

(10) Patent No.: US 7,284,219 B1
(45) Date of Patent: Oct. 16, 2007

(54) REPRESENTATION OF A RELAXATION OF A CONSTRAINT BY GRAPH REPLICATION

(75) Inventors: Walter A. Manaker, Jr., Boulder, CO (US); Matthew Bixler, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 436 days.

(21) Appl. No.: 11/060,017

(22) Filed: Feb. 17, 2005

(51) Int. Cl.
 *G06F 17/50* (2006.01)
(52) U.S. Cl. ......................................................... 716/7
(58) Field of Classification Search ...................... 716/7
 See application file for complete search history.

(56) References Cited

U.S. PATENT DOCUMENTS

| 5,450,535 | A  | * | 9/1995 | North | ........................... | 345/440 |
| 6,086,631 | A  | * | 7/2000 | Chaudhary et al. | ............ | 716/16 |
| 6,289,488 | B1 | * | 9/2001 | Dave et al. | ...................... | 716/1 |
| 6,334,205 | B1 | * | 12/2001 | Iyer et al. | ........................ | 716/7 |
| 7,024,639 | B2 | * | 4/2006 | Teig et al. | ...................... | 716/3 |
| 7,089,521 | B2 | * | 8/2006 | Kurzum et al. | ................ | 716/10 |

OTHER PUBLICATIONS

David Blaauw et al.; "Removing User-Specified False Paths from Timing Graphs"; Copyright 2000 ACM; DAC 2000; pp. 270-273.

H.C. Yen et al.; "A path Selection Algorithm for Timing Analysis"; Copyright 1988 IEEE; 25th ACM/IEEE Design Automation Conference; Paper 43.5; pp. 720-723.

Robert E. Hitchcock, Sr.; "Timing Verification and the Timing Analysis Program"; Copyright 1982 IEEE; 19th Design Automation Conference; Paper 34.2' pp. 594-604.

* cited by examiner

*Primary Examiner*—Jack Chiang
*Assistant Examiner*—Brandon W. Bowers
(74) *Attorney, Agent, or Firm*—LeRoy D. Maunu; Lois D. Cartier

(57) ABSTRACT

Various embodiments of the invention determine whether paths of a first graph satisfy a constraint based on a plurality of sub-graphs of the first graph. Each graph is a directed acyclic graph of nodes and arcs. The first graph and a second graph are generated in a memory arrangement, with the first graph and the second graph having a shared sub-graph, and each path of the paths of the first graph is constrained by the constraint unless the path is a path of the second graph. The plurality of sub-graphs of the first graph are generated in the memory arrangement with each of the plurality of sub-graphs not including any path of the second graph and each of the paths of the first graph that is not a path of the second graph being included in at least one of the plurality of sub-graphs.

20 Claims, 5 Drawing Sheets

REPRESENTATION OF A RELAXATION OF A CONSTRAINT BY GRAPH REPLICATION

FIELD OF THE INVENTION

The present invention generally relates to relaxation of constraints in graph representations.

BACKGROUND

A directed acyclic graph (DAG) is a useful representation for verifying compliance to a constraint that may be a set of individual constraints. Example constraints are a time constraint, such as a schedule for completing a project with multiple dependencies, and a distance constraint, such as a requirement that certain interrelated components must be arranged to fit within an available space.

Another example for a timing constraint is static timing analysis of an electronic circuit, which may have the requirement that particular circuit paths have a cumulative delay along the path that is less than or greater than a given value, which may be explicitly or implicitly specified. For static timing analysis, the DAG may have nodes representing circuit elements and arcs representing connections between the circuit elements. Each arc or node may have an associated delay value representing the propagation delay through the arc or node. By adding the delay values for the arcs and/or nodes along the path, the total propagation delay along the path may be determined and compared with the path requirement.

A DAG has a set of source nodes and a set of sink nodes. Typically, a constraint for a DAG is a constraint between some of the source nodes and some of the sink nodes. Numerous paths may exist between a particular source and a particular sink. A graph search of the DAG may efficiently determine the worst case paths. Enumeration of all paths represented by the DAG may be avoided because the DAG satisfies the constraint if the worst case paths satisfy the constraint.

A relaxation of a constraint may specify that certain paths between a source and a sink may be disregarded in verifying compliance to the constraint, or may have a relaxed requirement. The relaxation overrides the constraint. Example relaxations are multi-cycle paths and false paths for a synchronous electronic circuit, or false or irrelevant paths in an asynchronous circuit.

An example multi-cycle path in a synchronous electronic circuit may have a source that is known, a priori, to change the transmitted value only in even clock cycles and a sink that is known, a priori, to ignore the received value in odd clock cycles. Thus, this particular path may provide correct circuit operation when the cumulative delay along the path is as much as two clock periods. A constraint that paths have a total delay of less than one clock period may be relaxed for the multi-cycle path.

An example false path in a synchronous electronic circuit may be an apparent path that is impossible to exercise. For example, a multiplexer control signal may control two separate multiplexers, and a path from a source to a sink may pass through a different respective input of each multiplexer. The propagation of signal values along the path is then interrupted, regardless of the value of the multiplexer control signal, by one of the multiplexers. Because a value change of the source cannot propagate along the path to a value change of the sink, the cumulative delay along the path may be unconstrained. A constraint that paths have a total delay of less than one clock period may be relaxed for the false path.

One approach to representing a relaxation of a constraint is to perform node replication and select arc replication and removal within the DAG to isolate the relaxation paths from the remaining constraint paths. However, the duplicated nodes in the DAG may complicate other graph operations, such as node searches.

The present invention may address one or more of the above issues.

SUMMARY OF THE INVENTION

Various embodiments of the invention determine whether paths of a first graph satisfy a constraint based on a plurality of sub-graphs of the first graph. Each graph is a directed acyclic graph of nodes and arcs. The first graph and a second graph are generated in a memory arrangement, with the first graph and the second graph having a shared sub-graph, and each path of the paths of the first graph is constrained by the constraint unless the path is a path of the second graph. The plurality of sub-graphs of the first graph are generated in the memory arrangement with each of the plurality of sub-graphs not including any path of the second graph and each of the paths of the first graph that is not a path of the second graph being included in at least one of the plurality of sub-graphs.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
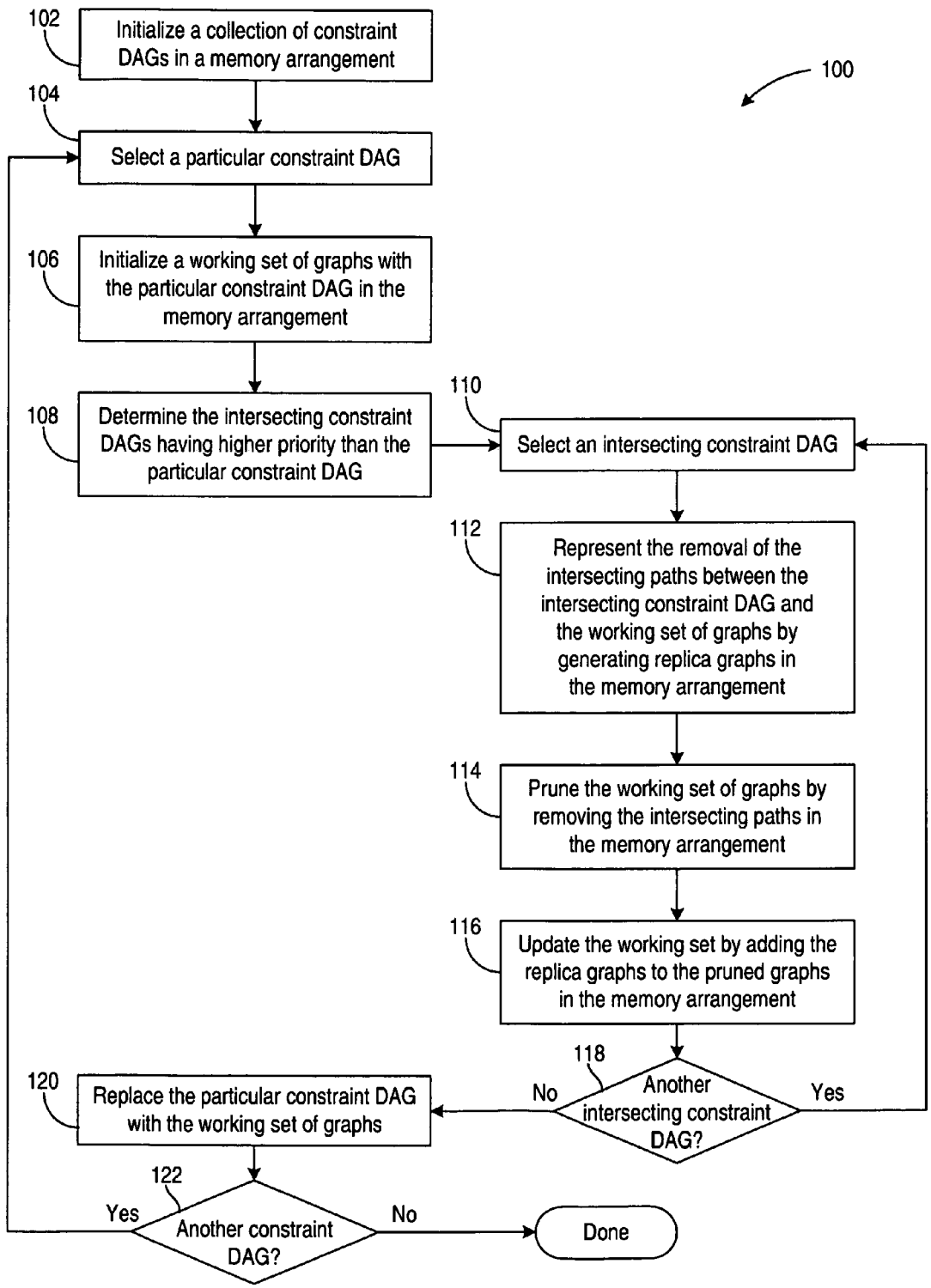
FIG. 1 is a flow diagram for a process for analyzing multiple overlapping constraints using graph replication, according to various embodiments of the invention.

Various embodiments of the invention represent a relaxation of a constraint using graph replication. The constraint and the relaxation may each be represented as a directed acyclic graph (DAG). Sub-graphs of the DAG for the constraint are replicated in replica graphs that collectively represent the relaxing of the constraint by the relaxation.

A DAG includes nodes and arcs with each arc directed from one node to another node. A source may be a node that is included in the arcs of the DAG only as a node from which arcs originate. A sink may be a node that is included in the arcs of the DAG only as a node to which the arcs terminate.

A path of the DAG typically may be represented as a sequence of nodes beginning at a source and ending at a sink, with the DAG including an arc directed along the path for each adjacent pair of nodes in the sequence. Alternatively, a path may be represented as the series of arcs along the path, or as a combination of these nodes and these arcs.

The circuit topology of an electronic circuit may be represented by a DAG. For example, the nodes in the DAG may represent various devices in the electronic circuit and the arcs may represent connections between the various devices, with the sources representing the outputs of registers or the inputs of the electronic circuit, and the sinks representing the inputs of registers or the outputs of the electronic circuit.

An electronic circuit may have timing constraints, such that the propagation delay accumulated along paths from register outputs and circuit inputs to register inputs and circuit outputs should be less than a given time interval, such as the period of a clock for a synchronous electronic circuit. For an electronic circuit with a general timing constraint that the propagation delay along all paths should be less than a given time interval, the constraint DAG may be represented by a DAG corresponding to the circuit topology of the electronic circuit. It will be appreciated that the constraint DAG may include more than or less than the DAG for the circuit topology of the electronic circuit, for example, an electronic circuit may have circuit outputs that are register outputs, such that the paths of the circuit topology from register outputs to circuit outputs do not need to be included in the constraint DAG.

During static timing analysis, a search of the constraint DAG, such as a breadth first search or a depth first search, may be used to determine the worst case propagation delay to any node of the DAG. If the worst case propagation delay to each of the sink nodes is less than the given time interval, then the electronic circuit satisfies the general timing constraint.

An electronic circuit may have several timing constraints with each timing constraint applying to a different set of paths. Typically an electronic circuit has a general timing constraint that applies by default to all paths and supplemental timing constraints providing relaxed constraints that override the general timing constraint for a select set of paths. The supplemental timing constraints may include slow path exceptions, such as multi-cycle paths, and false paths. Typically the supplemental timing constraints are provided as a listing of constraint specifications, with each constraint specification providing the type of constraint and a specification of the paths for the constraint, such as the sources, sinks, and possibly certain intermediate nodes of the paths for the constraint.

Generally a priority may be provided for the general timing constraint and the supplemental timing constraints. For example, the general timing constraint may have the lowest priority and the supplemental timing constraints may have priorities according to a limit value for each timing constraint. Alternatively, the supplemental timing constraints may have increasing priorities according to the order of the supplemental timing constraints in the listing of constraint specifications. For a path included in multiple timing constraints, the highest priority timing constraint may provide the timing constraint that the path should satisfy during static timing analysis for the electronic circuit.

An example electronic circuit may have a low priority general timing constraint for all paths, a middle priority multi-cycle path, and a high priority false path. Each constraint may have a corresponding DAG, with the general timing constraint having a general DAG, the multi-cycle path having a multi-cycle-path DAG, and the false path having a false-path DAG. To determine whether the example electronic circuit satisfies the constraints, the general DAG may be checked after removing the paths of the multi-cycle-path DAG and the false-path DAG, and the multi-cycle-path DAG may be checked after removing the paths of the false-path DAG. Generally a false-path DAG is always satisfied and does not need to be checked. For the checking of the general DAG, the general DAG corresponds to the constraint DAG and the multi-cycle-path DAG and the false-path DAG each correspond to a relaxation DAG. For the checking of the multi-cycle-path DAG, the multi-cycle-path DAG corresponds to the constraint DAG and the false-path DAG corresponds to the relaxation DAG.

Various embodiments of the invention represent a relaxation of a constraint using graph replication, with the constraint represented by a constraint DAG and the relaxation represented by a relaxation DAG. A constraint DAG may be relaxed by a series of relaxation DAGs, and constraint validation during static timing analysis may require multiple constraint DAGs, each of which may be relaxed by a series of one or more relaxation DAGs.

The paths of the relaxation DAG that are also paths of the constraint DAG are paths of the intersection between the constraint DAG and the relaxation DAG, with the intersection being a sub-graph of both the constraint DAG and the relaxation DAG. The relaxation DAG is an intersecting graph of the constraint DAG. In certain cases, the intersection between the relaxation DAG and the constraint DAG is the relaxation DAG, as may occur when the relaxation DAG is a sub-graph of the constraint DAG. It will be appreciated that the relaxation DAG may include paths that are not paths of the constraint DAG. It will also be appreciated that a topology DAG for an electronic circuit may include paths that are not included in either a constraint DAG or a relaxation DAG for the electronic circuit.

FIG. 1 is a flow diagram for a process for analyzing multiple overlapping constraints using graph replication, according to various embodiments of the invention.

When constraints overlap with an intersection between the corresponding constraint DAGs, the constraint with the highest priority provides the constraint for the intersecting paths in the intersection.

At step 102, the DAGs for each of the multiple constraints are created in a memory arrangement, which may be the virtual memory system of a general purpose computer. An iteration loop over all the constraint DAGs is started by selecting one of the constraint DAGs at step 104, with each constraint DAG typically selected according to constraint priority beginning with the lowest priority constraint. At step 106, a working set of constraint DAGs is initialized with the constraint DAG selected at step 104. At step 108, the intersecting constraint DAGs having higher priority than the constraint DAG that was selected at step 104 are determined, and may include determining whether a higher priority constraint DAG intersects the constraint DAG selected at step 104 with a non-null intersection that includes some intersecting paths.

An iteration loop over all the intersecting constraint DAGs is started by selecting one of the intersecting constraint DAGs at step 110. The intersecting constraint DAG corresponds to an intersecting relaxation DAG. At step 112, the intersecting paths between the working set of graphs and the intersecting constraint DAG are removed from the working set of graphs by generating replicas of sub-graphs of each graph in the working set in the memory arrangement.

The working set of graphs is pruned by removing the intersecting paths at step 114, and the generated replicas are added to the working set at step 116.

Whether an additional intersecting constraint DAG is available is checked at decision 118. If an additional intersecting constraint DAG is available, process 100 continues an iteration loop by returning to step 110, otherwise process 100 proceeds to step 120. At step 120, the constraint DAG selected at step 104 is replaced with the current contents of the working set of graphs.

Whether an additional constraint DAG is available is checked at decision 122. If an additional constraint DAG is available, process 100 continues an iteration loop by returning to step 104, otherwise process 100 is done. On completing process 100, the memory arrangement includes DAGs that may be individually analyzed. The original constraints are satisfied when the analysis determines that each DAG is individually satisfied.

Figure 2:
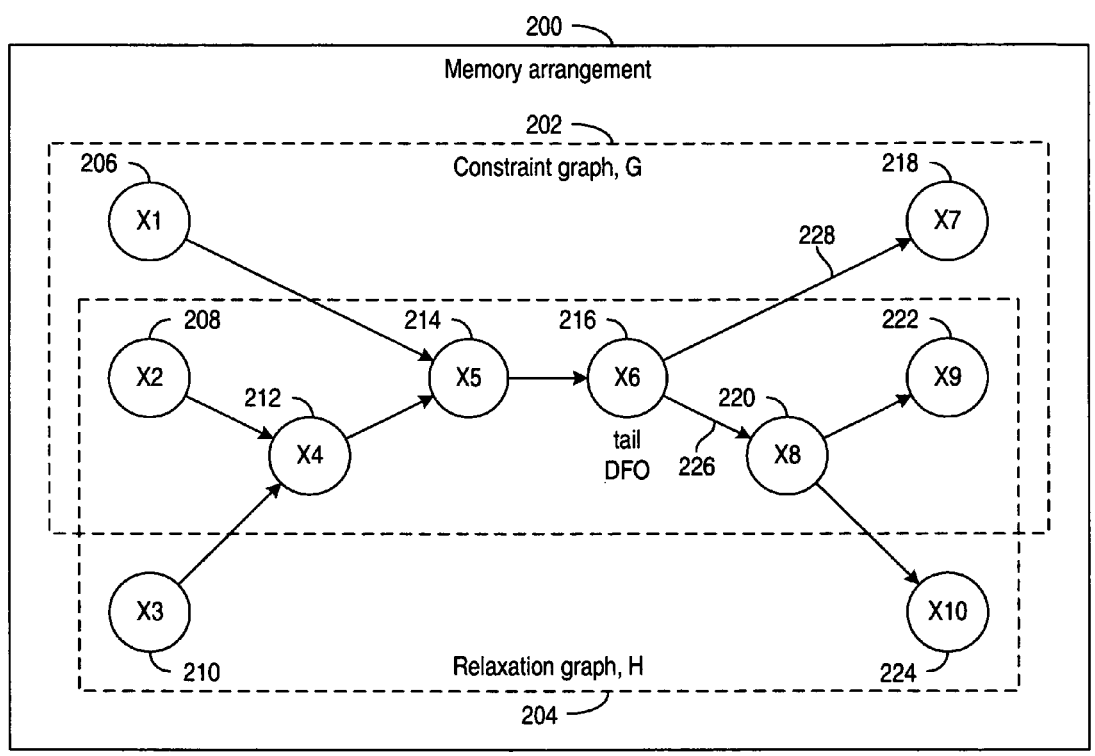
FIG. 2 is an example constraint DAG and intersecting relaxation DAG, according to various embodiments of the invention.

FIG. 2 is an example constraint DAG 202 and intersecting relaxation DAG 204, according to various embodiments of the invention. The constraint DAG 202 and the relaxation DAG 204 may be represented in a memory arrangement 200, such as the virtual memory of a general purpose computer.

An example electronic circuit may have logic blocks corresponding to nodes X1 206 through X10 224, with nodes X1 206, X2 208, and X3 210 as sources, and nodes X7 218, X9 222, and X10 224 as sinks. The electronic circuit may have two constraints, constraint G 202 and relaxation H 204, with constraint G 202 being relaxed by the higher-priority relaxation H 204, which may have a slow path exception or a false path. The constraint G 202 may provide a constraint for the paths from certain sources {X1 206, X2 208} to certain sinks {X7 218, X9 222}. The higher-priority relaxation H 204 may provide a relaxed constraint for the paths from certain sources {X2 208, X3 210} to certain sinks {X9 222, X10 224}.

Note that the two constraints G202 and H204 have a common path, namely the path from source X2 208 to sink X9 222. Therefore the static timing analysis of constraint G 202 with relaxation H 204 should not include this path from source X2 208 to sink X9 222. In certain examples, the constraint G may be modified to remove the paths of a relaxation H by deleting sources and/or sinks from the constraint G, as is later discussed in detail. However, the source X2 208 cannot be deleted from the constraint 202 because deleting source X2 208 would additionally remove the path from X2 208 to X7 218 that should be checked during static timing analysis. Similarly, the sink X9 222 cannot be deleted from constraint 202 because deleting sink X9 222 would additionally remove the path from source X1 206 to sink X9 222.

The paths for a relaxation H204 cannot be removed from a constraint G 202 by deleting of certain of the sources X1 206 and X2 208 and/or certain of the sinks X7 218 and X9 222 because the constraint G 202 and relaxation H 204 have at least one divergent fanout node (DFO) 216. A DFO is a node of a constraint that has one or more fanout arcs directed to a node within the relaxation, and one or more fanout arcs directed to a node outside the relaxation. For example, node X6 216 has a fanout arc 226 directed to node X8 220 within the relaxation H 204, and a fanout arc 228 directed to node X7 218 outside the relaxation H204. Thus, node X6 216 is a DFO. A tail DFO is a DFO having a path passing through the DFO to a sink that does not have another DFO between the tail DFO and the sink. For example, paths passing through DFO X6 216 to sink X7 218 do not have another DFO between DFO X6 216 and sinks X7 218 or X9 222; thus, DFO X6 216 is a tail DFO.

Figure 3A:
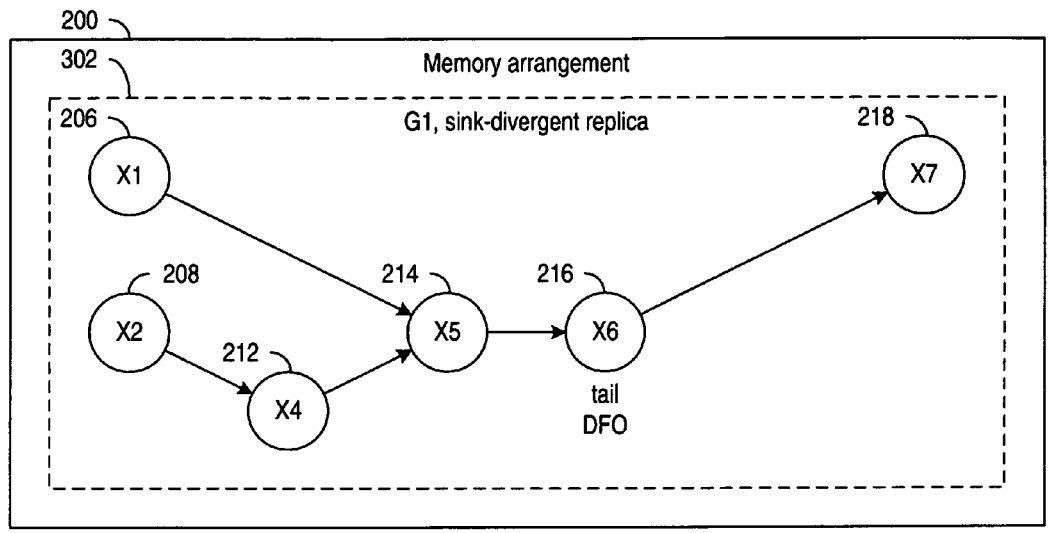
FIG. 3A and FIG. 3B are example replica sub-graphs corresponding to the example of FIG. 2, according to various embodiments of the invention.
Figure 3B:
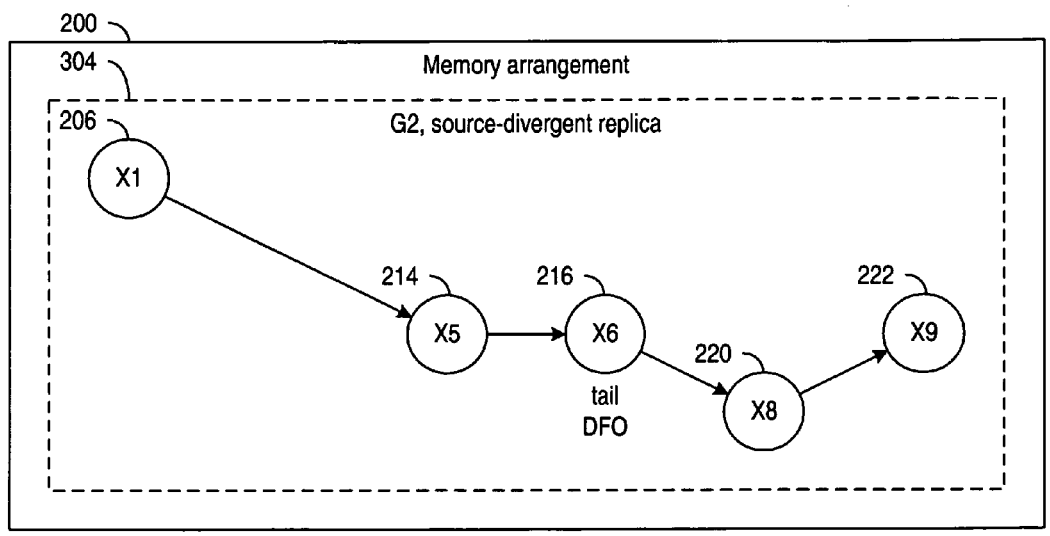

FIG. 3A and FIG. 3B are example replica sub-graphs 302 and 304 corresponding to the example of FIG. 2, according to various embodiments of the invention. The paths of constraint G 202 that are not paths of relaxation H 204 of FIG. 2 are included in the paths of the replicas 302 and 304. The collective results of respective static timing analyses of the replicas 302 and 304 may correspond to the static timing analysis of constraint G 202 with relaxation H 204 of FIG. 2.

Replica G1 302 may include the paths from source nodes S1, X1 206 and X2 208, with S1∈G to sink node T1, X7 218, with T1∈G and T1∉H. Replica G2 304 may include the path from source node S2, X1 206, with S2∉G and S2∉H to sink node T1, X9 222, with T1∈G and T1∈H. Replacing the original constraint graph G 202 of FIG. 2 with the replica sub-graphs G1 302 and G2 304 removes the intersecting path, from source X2 208 to sink X9 222, while preserving all other paths of G 202.

For a path of constraint G 202 to not be a path of relaxation H204 of FIG. 2 and thus be preserved in a replica 302 and 304, the path must diverge from relaxation H 204 by passing though nodes and/or arcs that are not included in relaxation H204. Replica G1 302 is a sink-divergent replica because replica G1 302 only includes sinks, X7 218, that are not included in relaxation H, thus all paths of replica G1 302 diverge from relaxation H at least at the sinks, X7 218. Replica G2 304 is a source-divergent replica because replica G2 304 only includes sources, X1 206, that are not included in relaxation H, thus all paths of replica G2 304 diverge from relaxation H at least at the sources, X1 206.

For efficient constraint analysis, typically the replicas 302 and 304 are generated to preserve paths of constraint G that are not paths of relaxation H, such that each preserved path is included in exactly one of the replicas 302 and 304 as shown in FIG. 3A and FIG. 3B. Duplicated computations for the constraint analysis may be eliminated when each preserved paths is included in exactly one of the replicas 302 and 304. It will be appreciated that each preserved path could be duplicated in multiple replicas 302 and 304 without affecting the result for certain types of constraint analysis, such as determining whether an electronic circuit satisfies the constraints during static timing analysis.

FIG. 4A, FIG. 4B, FIG. 4C, and FIG. 4D illustrate classifications for paths between sources and sinks with Venn diagrams for sources, sinks, and intermediate nodes, according to various embodiments of the invention. The classifications identify paths of G that are not paths of H as paths that are source-divergent, sink-divergent, or intermediate-divergent paths.

Figure 4A:
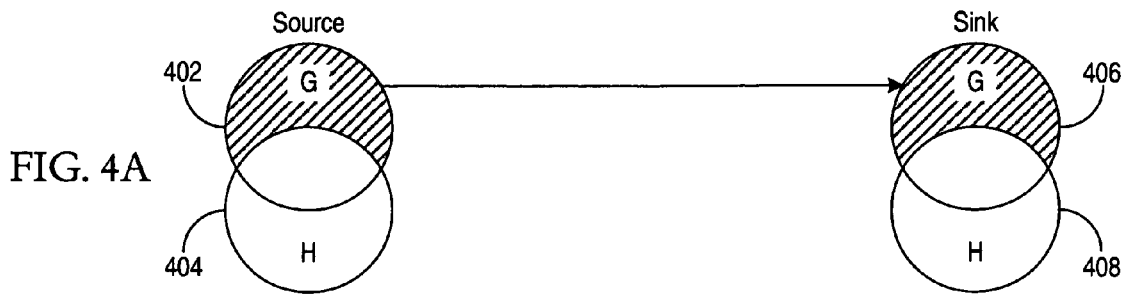
FIG. 4A, FIG. 4B, FIG. 4C, and FIG. 4D illustrate classifications for paths between sources and sinks with Venn diagrams for sources, sinks, and intermediate nodes, according to various embodiments of the invention.
Figure 4B:
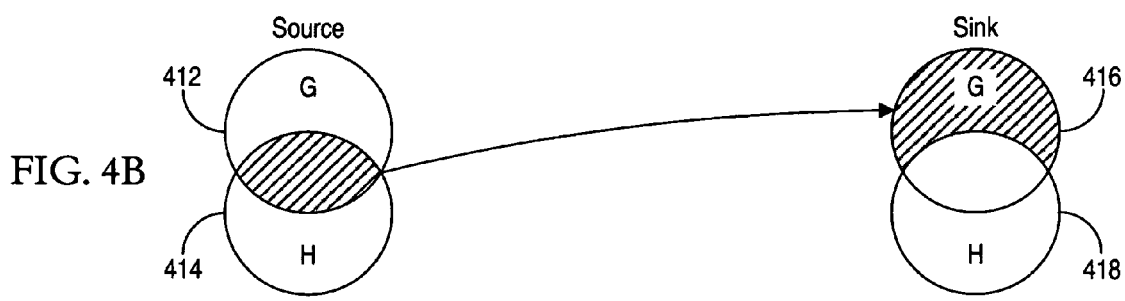
Figure 4C:
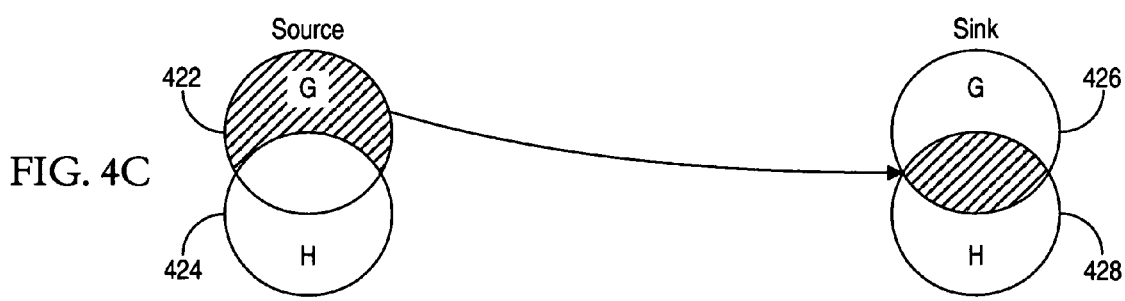
Figure 4D:
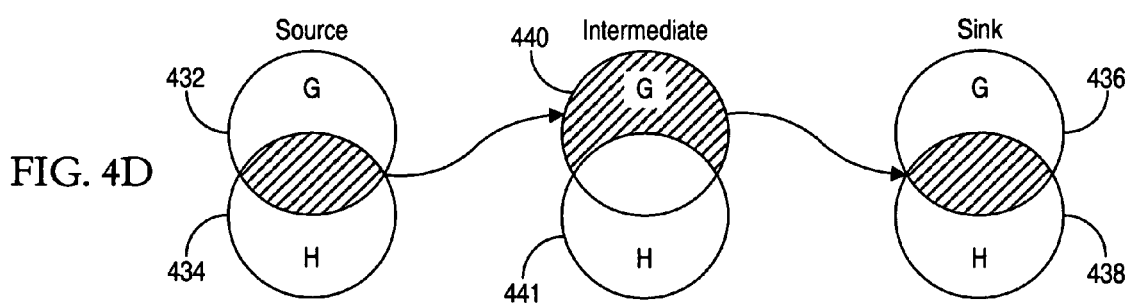

FIG. 4A illustrates paths that begin in G402 but not in H404 and that end in G 406 but not in H 408. Thus, FIG. 4A illustrates paths that are both source-divergent and sink-divergent. FIG. 4B illustrates paths that begin in the intersection of G 412 and H 414 and that end in G 416 but not in H 418. Thus, FIG. 4B illustrates paths that are sink-divergent. FIG. 4C illustrates paths that begin in G 422 but not in H 424 and that end in the intersection of G 426 and H 428. Thus, FIG. 4C illustrates paths that are source-divergent. FIG. 4D illustrates paths that begin in the intersection of G 432 and H 434 and end in the intersection of G 436 and H 438, while passing through an intermediate node that is in G 440 but not in H 441. Thus, FIG. 4D illustrates paths that are intermediate-divergent.

Each path of G that is not a path of H may be classified according to one of FIGS. 4A through 4D. In one embodiment, the classifications illustrated in FIG. 4A and FIG. 4B are combined into one classification as shown in the sink-divergent replica 302 for the example of FIG. 3A. It will be appreciated that other classification combinations are possible, such a combining the classifications illustrated in FIGS. 4A and 4C.

Figure 5:
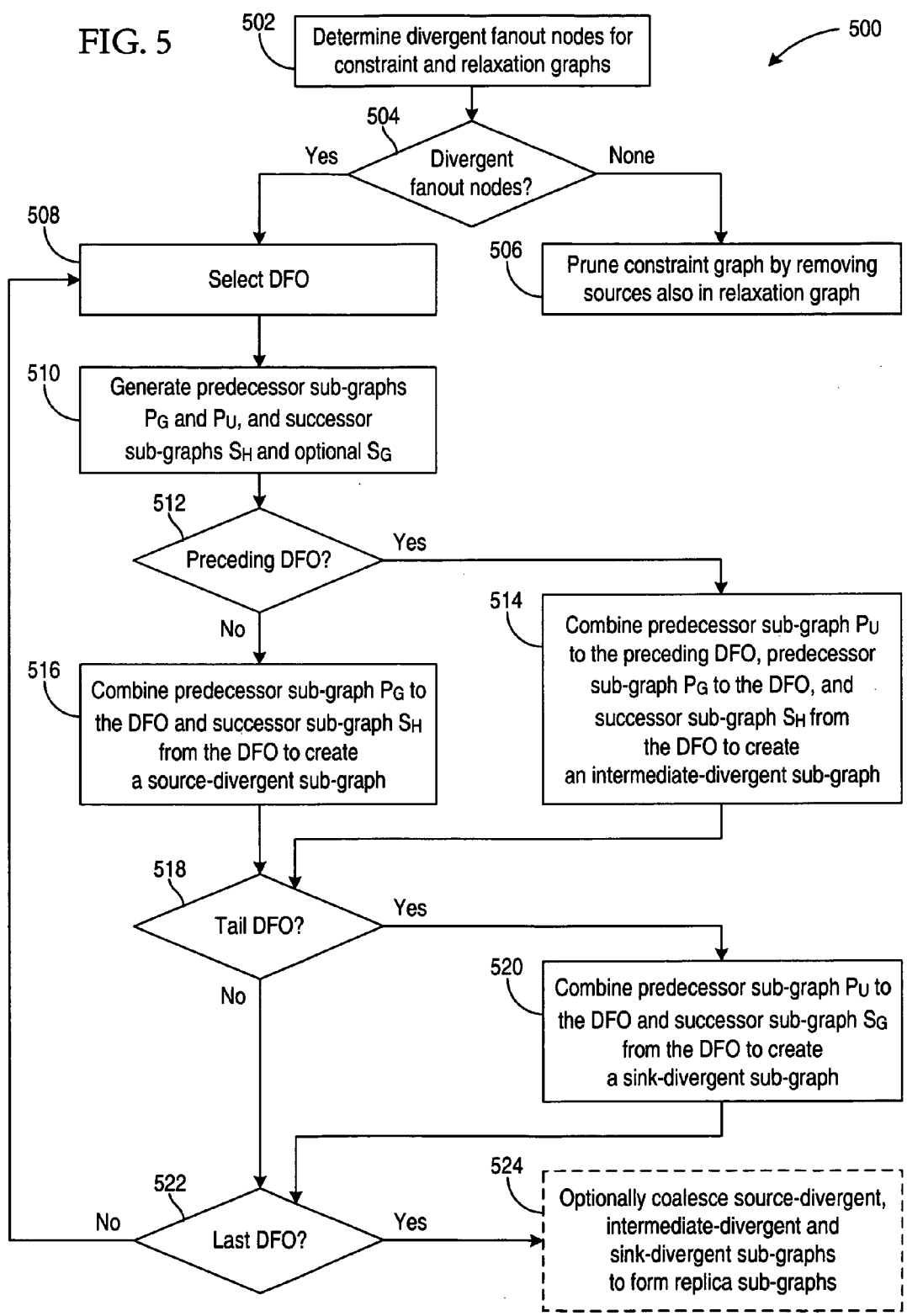
FIG. 5 is a flow diagram for a process for removing paths of a relaxation from paths of a constraint, according to various embodiments of the invention.

FIG. 5 is a flow diagram for a process 500 for removing paths of a relaxation from paths of a constraint, according to various embodiments of the invention. A DAG represents a constraint G and another DAG represents a relaxation H that intersects G and takes precedence over G.

At step 502, the set of DFO for graph G relative to intersecting graph H is determined. The pseudo-code for an example process for determining the set of DFO for graph G relative to intersecting graph H using a depth first search (DFS) is set forth in Example 1 below.

---

Finding the DFOs of a graph G for intersecting graph H

```
FindDFOs(G,H)
{
  DFO = Ø
  foreach sink node∈ G
    DFO_DFS(node)
}
DFO_DFS(node)
{
  node.discovered ← true
  foreach input arc∈ node
  {
    inputnode ← arc.fromnode
    if (node∈H) and (inputnode∈ H)
      DFO ← DFO ∪ inputnode
    if (!inputnode.discovered)
      DFO_DFS(inputnode)
  }
}
```

---

EXAMPLE 1

The method above performs graph searching from the sinks of graph G. It will be appreciated that the arcs of G may be doubly-linked to permit a graph search from the sinks of G, and that alternatively the graph search could be performed starting from the sources of G.

If graph G relative to intersecting graph H does not include any DFO, process 500 proceeds from decision 504 to step 506, with G not having any paths that begin at sources S∈H and end at sinks T∉H. Consequently, sources S∈G and S∈H may simply be pruned at step 506 to remove the paths of H from G without destroying any other paths in G.

If DFO do exist, process 500 proceeds from decision 504 to step 508, and paths from sources S∈G and S∈H may reach sinks T∉H, or paths may diverge from H and reconverge to H, defining paths in G that must be preserved after removing the paths in H. Two major steps may preserve these paths while removing the paths of H from G using graph replication by first determining and second combining certain sub-graphs of G.

These certain sub-graphs of G include reachability information for paths in G that pass through each DFO and include successor sub-graphs from the DFO and predecessor sub-graphs to the DFO. A successor sub-graph may include the portion of G following the DFO on certain paths through the DFO to certain sinks. A predecessor sub-graph may include the portion of G preceding the DFO on certain paths from certain sources through the DFO. For each DFO, we define the following sub-graphs in G:

$S_G$ Successor sub-graph from the DFO to a sink T∈G along paths that diverge from H.

$S_H$ Successor sub-graph from the DFO to a sink T∈G and T∈H along paths that remain in H.

$P_G$ Predecessor sub-graph to DFO from a source S∈G or a preceding DFO along paths that diverge from H.

$P_U$ Predecessor sub-graph to DFO from any source S∈G along any unrestricted path.

An example process for computing $S_G$, $S_H$, $P_G$, and $P_U$ for each DFO using a depth first search (DFS) of graph G is set forth in the pseudo-code of Example 2.

---

Computing $S_G$, $S_H$, $P_G$, and $P_U$ for each DFO

```
DFOInfo(G,H)
{
  /* Compute S_G only for tail DFOs */
  S_G = nodes and arcs reachable from DFS(from all sinks T∈ G,
    through some node N∈H, to DFO)
  /* Compute S_H for all DFOs */
  S_H = nodes and arcs reachable from DFS(from all sinks T∈ G
    and T∈ H, through node N∈ H, to DFO)
  /* Compute P_G for all DFOs */
  P_G = nodes and arcs reachable from DFS(from DFO, through
    some node N∈H, to source S∈ G or a preceding DFO)
  /* Compute P_U for all DFOs */
  P_U = nodes and arcs reachable from DFS(from DFO to any
    source S∈ G)
}
```

---

EXAMPLE 2

At step 508, an iteration loop over the DFO is started by selecting a DFO. At step 510 the predecessor sub-graphs $P_G$ and $P_U$ and the successor sub-graph $S_H$ may be generated. The successor sub-graph $S_G$ may also be generated at step 510 if the DFO is a tail DFO. The generation of successor sub-graph $S_G$ may be optional if the DFO is not a tail DFO. Paths of G passing through the DFO and ending in the sub-graph $S_G$ diverge from H because the portion of the paths between the DFO and the sinks is not entirely in H. Thus, a graph diverges from H that has sub-graph $S_G$ following the DFO. Paths of G starting in the sub-graph $P_G$ and passing through the DFO diverge from H because the portion of the paths preceding the DFO is not entirely in H. Thus, a graph diverges from H that has sub-graph $P_G$ preceding the DFO.

At decision 512 the existence of a preceding DFO is checked. If a preceding DFO exists, process 500 proceeds to step 514, otherwise process 500 proceeds to step 516. At step 514, a replica is generated by combining the predecessor sub-graph $P_U$ to the preceding DFO, the predecessor sub-graph $P_G$ to the DFO, and the successor sub-graph $S_H$ from the DFO to yield an intermediate-divergent replica. At step 516, a replica is generated by combining the predecessor sub-graph $P_G$ to the DFO and the successor sub-graph $S_H$ from the DFO to yield a source-divergent replica.

Decision 518 checks whether the DFO is a tail DFO. If the DFO is a tail DFO, process 500 proceeds to step 520, otherwise process 500 proceeds to decision 522. At step 520, a replica is generated by combining the predecessor sub-graph $P_U$ to the DFO and the successor sub-graph $S_G$ from the DFO to yield a sink-divergent replica. Note that for a tail DFO two replicas are created.

The combining of the predecessor and successor sub-graphs of decisions 512 and 518 and steps 514, 516, and 520 creates replicas that preserve the paths of G that are not paths of H with each preserved path included in exactly one replica; no paths are duplicated. The pseudo-code of Example 3 shows and example process for combining the predecessor and successor sub-graphs is:

---
Creating replica graphs for each DFO
---

```
Replicate(G)
{
  markednodes ← ∅
  foreach DFO
  {
    /* Case 3a: If a tail DFO, create a new graph of all
    predecessors and a diverging successor */
    if (∀n∈ DFO.S_G, n∈DFO)
      new Tw_Graph(DFO.P_U ∪ DFO ∪ DFO.S_G)
      markednodes ← markednodes ∪ DFO.P_U ∪ DFO ∪ DFO.S_G
    /* Case 3b: For a preceding DFO, create new graph with
    all predecessors of the preceding DFO, followed by
    a divergence, followed by no divergence from H */
    if (∃ DFO2∈ DFO.P_G)
      new
      Tw_Graph(DFO2.P_U ∪ DFO2 ∪ DFO.P_G ∪ DFO ∪ DFO.S_H)
      markednodes ← markednodes
      DFO2.P_U ∪ DFO2 ∪ DFO.P_G ∪ DFO ∪ DFO.S_H
    /* Case 3c: Otherwise create new graph with diverging
    predecessors followed by no divergence from H */
    else
      new Tw_Graph(DFO.P_G ∪ DFO ∪ DFO.S_H)
      markednodes ← markednodes ∪ DFO.P_G ∪ DFO ∪ DFO.S_H
  }
}
```

EXAMPLE 3

For additional DFO, process 500 iterates by returning to step 508 from decision 522, and otherwise process 500 proceeds to step 524. At step 524 certain replica graphs may optionally be combined to reduce the number of graphs. Replica graphs created for the tail DFOs at step 520 "case 3a" may be combined. Replica graphs created at step 516 for "case 3c" with the DFO being a head DFO (DFOs that may directly reach a source of G without passing through another DFO) may also be combined. Replicas created by step 514 for "case 3b" may not be combined, as combining these replicas will inadvertently re-create paths the process intends to remove. While constructing a $P_G$ at step 510, the $P_G$, may be marked if the search terminates at a source of G instead of at another DFO. The replicas created at steps 510, 514, and 518 that contain a particular marked $P_G$ may be combined.

When constructing $S_G$ and $P_G$ at step 510, the search should traverse H from sinks T∈H until the DFS diverges from H to accommodate intersections that diverge at predecessors of the sinks of G. A list of nodes that are reachable from cross edges in H that are also reachable from G (without passing through a DFO) may need to be constructed. These nodes of G should be preserved since they reach sources or sinks not in H. However, the cross edges to them from H can be removed.

Those skilled in the art will appreciate that various alternative computing arrangements, including one or more processors and a memory arrangement configured with program code, would be suitable for hosting the processes of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for analyzing circuit designs. Other aspects, embodiments, and applications of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for determining whether paths of a first graph satisfy a constraint, comprising:
    generating the first graph in a memory arrangement, the first graph comprising subgraphs; generating a second graph in the memory arrangement, wherein each graph is a directed acyclic graph of nodes and arcs, each path in the first and second graphs begins at a source node and ends at a sink node, the first graph and the second graph have a shared sub-graph, and each path of the paths of the first graph is constrained by the constraint unless the path is a path of the second graph;
    generating a plurality of sub-graphs of the first graph in the memory arrangement, wherein each of the plurality of sub-graphs does not include any path of the second graph; and
    determining whether the paths of the first graph satisfy the constraint based on the plurality of sub-graphs.

2. The method of claim 1, wherein each of the paths of the first graph that is not a path of the second graph is included in exactly one of the plurality of sub-graphs.

3. The method of claim 2, wherein the nodes of the first graph include one or more of a first set of sources and one or more of a first set of sinks, each of the paths of the first graph is a path from one of the sources in the first set of sources to one of the sinks in the first set of sinks, the nodes of the second graph include a second set of one or more sources and a second set of one or more sinks, and each path of the second graph is a path from one of the sources in the second set of sources to one of the sinks in the second set of sinks.

4. The method of claim 3, wherein each source of the shared sub-graph is one of the sources of the first set of sources and the second set of sources, and each sink of the shared sub-graph is one of the sinks in the first set of sinks and the second set of sinks.

5. The method of claim 2, wherein the shared sub-graph is the second graph.

6. The method of claim 2, wherein the generating the plurality of sub-graphs further comprises determining divergent-fanout nodes, wherein each divergent-fanout node (DFO) is a node of the first graph having at least one arc directed to a node of the second graph and at least one arc directed to a node of the first graph that is not a node of the second graph.

7. The method of claim 6, further comprising, in response to no divergent-fanout node existing in the first graph, deleting sources for the second graph from the first graph in the memory arrangement.

8. The method of claim 6, wherein the generating the plurality of sub-graphs further comprises for each DFO, determining at least one predecessor sub-graph to the DFO and at least one successor sub-graph from the DFO.

9. The method of claim 8, wherein the generating the plurality of sub-graphs further comprises producing each of the plurality of the sub-graphs from at least one of the predecessor sub-graphs and one of the successor sub-graphs.

10. The method of claim 9, wherein a first predecessor sub-graph of the at least one predecessor sub-graph to each DFO includes the nodes and the arcs reachable, via at least one node that is not one of the nodes of the second graph, between the DFO and one or more predecessor nodes, wherein the one or more predecessor nodes are preceding DFO and sources of the first graph.

11. The method of claim 10, wherein a first successor sub-graph of the at least one successor sub-graph from each DFO includes the nodes and the arcs of the second graph reachable between the DFO and sinks of the second graph.

12. The method of claim 8, wherein a second predecessor sub-graph of the at least one predecessor sub-graph to each DFO includes the nodes and the arcs reachable between the DFO and the sources of the first graph.

13. The method of claim 12, wherein a second successor sub-graph of the at least one successor sub-graph from each DFO includes the nodes and the arcs reachable, via at least one node that is not one of the nodes of the second graph, between the DFO and the sinks of the first graph, wherein the DFO is a tail DFO.

14. The method of claim 13, wherein the producing each of the plurality of sub-graphs further comprises, for each DFO in response to the DFO having the one or more predecessor nodes not including the preceding DFO, producing a source-divergent sub-graph from combining the first predecessor sub-graph to DFO and the first successor sub-graph from the DFO.

15. The method of claim 14, wherein the producing each of the plurality of sub-graphs further comprises, for each DFO in response to the DFO having the one or more predecessor nodes including the preceding DFO, producing an intermediate-divergent sub-graph from combining the second predecessor sub-graph to the preceding DFO, the first predecessor sub-graph to the DFO, and the first successor sub-graph from the DFO.

16. The method of claim 15, wherein the producing each of the plurality of sub-graphs further comprises, for each DFO that is a tail DFO, producing a sink-divergent sub-graph by combining the second predecessor sub-graph to the DFO and the second successor sub-graph from the DFO.

17. The method of claim 16, wherein generating the plurality of sub-graphs further comprises producing each of the plurality of sub-graphs from the source-divergent sub-graph, the intermediate-divergent sub-graph, and the sink-divergent sub-graph corresponding to each DFO.

18. The method of claim 17 further comprising:
deleting the nodes and the arcs of the first graph that are included in the source-divergent sub-graph, the intermediate-divergent sub-graph, and the sink-divergent sub-graph corresponding to each DFO, yielding a pruned graph in the memory arrangement; and
iterating the generating the plurality of sub-graphs and the deleting, wherein for each iteration one of the pruned graph and the plurality of sub-graphs corresponds to the first graph, and the second graph corresponds to an additional graph including paths that are not constrained by the constraint.

19. The method of claim 18, wherein the first graph corresponds to an electronic circuit, the constraint corresponds to a timing constraint for the electronic circuit, and the second graph corresponds to one of a false path or a slow path exception, further comprising determining a worst-case timing path from graph searches for each of the plurality of sub-graphs and comparing the worst-case timing path to the timing constraint.

20. An apparatus for determining whether paths of a first graph satisfy a constraint, comprising:
means for generating the first graph in a memory arrangement, the first graph comprising subgraphs;
means for generating a second graph in the memory arrangement, wherein each graph is a directed acyclic graph of nodes and arcs, each path in the first and second graphs begins at a source node and ends at a sink node, the first graph and the second graph have a shared sub-graph, and each path of the paths of the first graph is constrained by the constraint unless the path is a path of the second graph;
means for generating a plurality of sub-graphs of the first graph in the memory arrangement, wherein each of the plurality of sub-graphs does not include any path of the second graph; and
means for determining whether the paths of the first graph satisfy the constraint based on the plurality of sub-graphs.

* * * * *